United States Patent [19]

Crawford

[11] Patent Number: 4,953,087
[45] Date of Patent: Aug. 28, 1990

[54] THREE-DIMENSIONAL IMAGES OBTAINED FROM TOMOGRAPHIC DATA HAVING UNEQUALLY SPACED SLICES

[75] Inventor: Carl R. Crawford, Milwaukee, Wis.

[73] Assignee: General Electric Company, Milwaukee, Wis.

[21] Appl. No.: 261,532

[22] Filed: Oct. 24, 1988

[51] Int. Cl.⁵ .......................... G06F 15/42; A61B 6/03
[52] U.S. Cl. ............................ 364/413.18; 364/413.19
[58] Field of Search ....................... 364/413.14–413.22, 364/518, 521, 522; 378/4

[56] References Cited

U.S. PATENT DOCUMENTS

| | | | |
|---|---|---|---|
| 4,075,700 | 2/1978 | Blay | 382/6 |
| 4,405,943 | 9/1983 | Kanaly | 358/133 |
| 4,472,822 | 9/1984 | Swift | 378/10 |
| 4,674,046 | 5/1987 | Ozeki et al. | 364/413.18 |
| 4,719,585 | 1/1988 | Cline et al. | 364/518 |
| 4,747,117 | 5/1988 | Albrecht et al. | 378/19 |
| 4,770,182 | 9/1988 | Damadian et al. | 128/653 |
| 4,831,528 | 5/1989 | Crawford et al. | 364/413.22 |
| 4,835,688 | 5/1989 | Kimura | 364/413.22 |

Primary Examiner—Clark A. Jablon
Attorney, Agent, or Firm—Douglas E. Stoner; James O. Skarsten

[57] ABSTRACT

Three-dimensional representations of the surface of a structure located in a three-dimensional space are formed from tomographic data collected in a medical diagnostic imaging system. The images include structures of specific interest displayed at a high resolution and adjacent structures to improve the perception of the structures of interest displayed at a low resolution. Total examination time is reduced because the total number of slices needed to form the image is reduced. A plurality of slices of different spacings are obtained and divided into first and second space portions (associated with different slice spacings). An interpolation factor which varies as a function of slice spacing is used in the dividing step to establish selected dimensions of first and second three-dimensional elements. The location of each of the first and second elements is specified as a function of the interpolation factor and the first and second three-dimensional elements which contain a portion of the surface are identified.

4 Claims, 4 Drawing Sheets

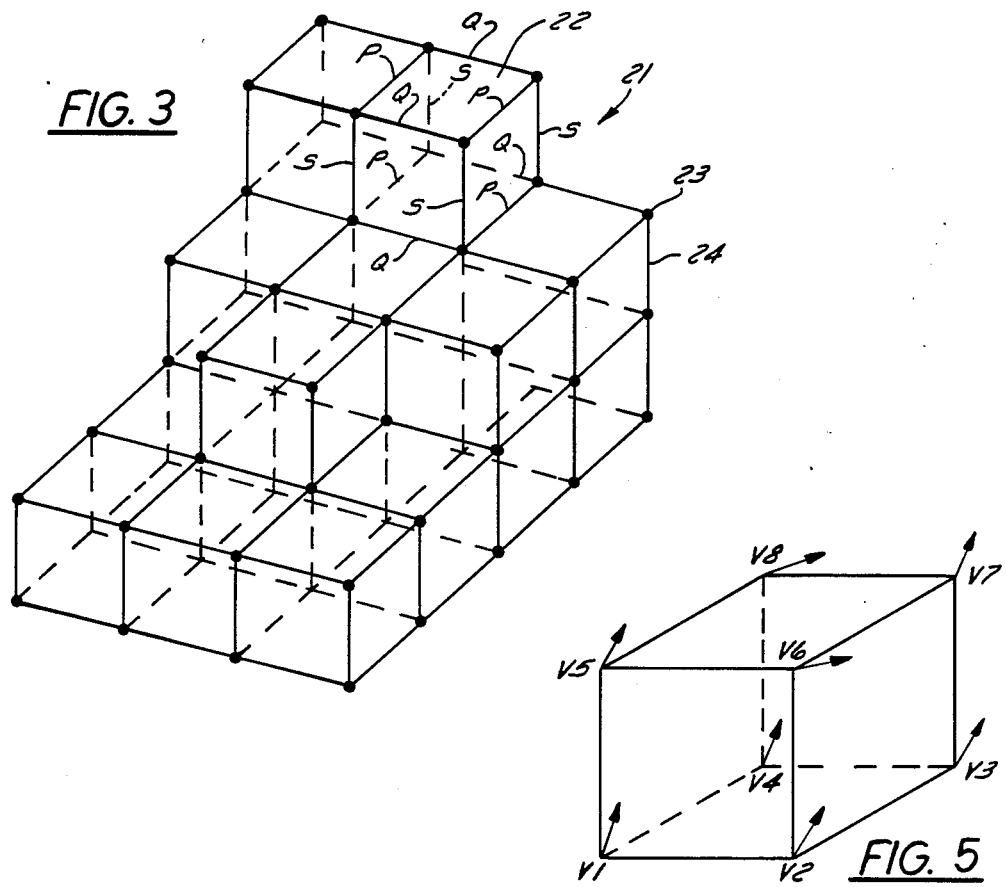
FIG. 3
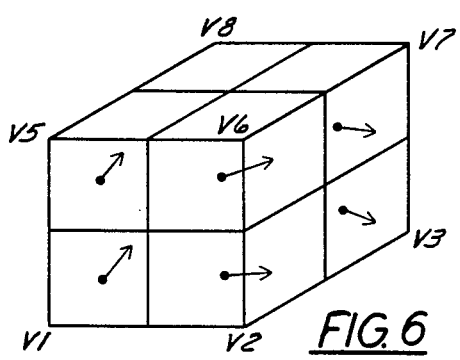
FIG. 5
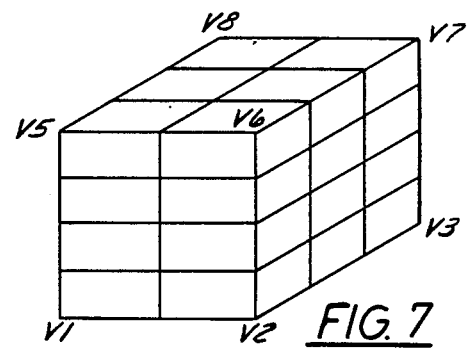
FIG. 6
FIG. 7

THREE-DIMENSIONAL IMAGES OBTAINED FROM TOMOGRAPHIC DATA HAVING UNEQUALLY SPACED SLICES

The present application is related to U.S. Ser. No. 261,533 and to U.S. Ser. No. 261,534 filed of even date; and to U.S. Ser. No. 125,662, U.S. Ser. No. 125,510, now U.S. Pat. No. 4,885,688 and U.S. Ser. No. 125,426, now U.S. Pat. No. 4,868,748, all three of which were filed on Nov. 25, 1987.

BACKGROUND OF THE INVENTION

The present invention relates in general to three-dimensional (3-D) display of tomographic data, and more specifically to forming 3-D images from a tomographic data set in which the slice resolution varies.

Tomographic medical imaging employs the collection of data representing cross sections of a body. A plurality of object interrogations can be processed mathematically to produce representations of contiguous cross-sectional images. Such cross-sectional images are of great value to the medical diagnostician in a non-invasive investigation of internal body structure. The technique employed to collect the data can be x-ray computed tomography, nuclear magnetic resonance tomography, single-photon emission tomography, positron emission tomography, or ultrasound tomography, for example.

A body to be imaged exists in three dimensions. Tomographic devices process data for presentation as a series of contiguous cross-sectional slices along selectable axes through the body. Each cross-sectional slice is made up of a number of rows and columns of voxels (parallelopiped volumes with certain faces corresponding to pixel spacing within each slice and others corresponding to slice spacing), each represented by a digitally stored number related to a computed signal intensity in the voxel. In practice, an array of, for example, 64 slices may each contain 512 by 512 voxels. In normal use, a diagnostician reviews images of a number of individual slices to derive the desired information. In cases where information about a surface within the body is desired, the diagnostician relies on inferences of the 3-D nature of the object derived from interrogating the cross-sectional slices. At times, it is difficult or impossible to attain the required inference from reviewing contiguous slices. In such cases, a synthesized 3-D image would be valuable.

Synthesizing a 3-D image from tomographic data is a two-step process. In the first step, a mathematical description of the desired object is extracted from the tomographic data. In the second step, the image is synthesized from the mathematical description.

Dealing with the second step first, assuming that a surface description can be synthesized from knowledge of the slices, the key is to go from the surface to the 3-D image. The mathematical description of the object is made up of the union of a large number of surface elements (SURFELS). The SURFELS are operated on by conventional computer graphics software, having its genesis in computer-aided design and computer-aided manufacturing, to apply surface shading to objects to aid in image interpretation through a synthesized two-dimensional image. The computer graphics software projects the SURFELS onto a rasterized image and determines which pixels of the rasterized image are turned on, and with what intensity or color. Generally, the shading is lightest (i.e., most intense) for image elements having surface normals along an operator-selected line of sight and successively darker for those elements inclined to the line of sight. Image elements having surface normals inclined more than 90 degrees from the selected line of sight are hidden in a 3-D object and are suppressed from the display. Foreground objects on the line of sight hide background objects. The shading gives a realistic illusion of three dimensions.

Returning now to the problem of extracting a mathematic description of the desired surface from the tomographic slice data, this step is broken down into two subtasks, namely the extraction of the object from the tomographic data, and the fitting of a surface to the extracted object. A number of ways are available to do the first subtask. For example, it is possible to search through the signal intensities in the voxels of a slice to discern regions where the material forming the object has sufficient signal contrast with surrounding regions. For example, signal intensities characteristic of bone in x-ray computed tomography have high contrast with surrounding tissue. A threshold may then be applied to the voxels to identify each one in the complete array lying in the desired object from all voxels not in the object.

Referring now to the second subtask, one technique for fitting a 3-D surface to the extracted object is known as the dividing cubes method which is disclosed in commonly assigned U.S. Pat. No. 4,719,585, issued Jan. 12, 1988, which is hereby incorporated by reference. By the dividing cubes method, the surface of interest is represented by the union of a large number of directed points. The directed points are obtained by considering in turn each set of eight cubically adjacent voxels in the data base of contiguous slices. Gradient values are calculated for these large cube vertices using difference equations. The vertices are tested against a threshold to determine if the surface passes through the large cube. If it does, then the large cube is subdivided to form a number of smaller cubes, referred to as subcubes or subvoxels. By interpolation of the adjacent point densities and gradient values, densities are calculated for the subcube vertices and a gradient is calculated for the center of the subcube. The densities are tested (e.g., compared to the threshold). If some are greater and some less than the threshold, then the surface passes through the subcube. In that case, the location of the subcube is output with its normalized gradient, as a directed point. It is also possible to define a surface using a range of densities (e.g., an upper and a lower threshold). Thus, where thresholds are mentioned herein, a range is also intended to be included. The union of all directed points generated by testing all subcubes within large cubes through which the surface passes, provides the surface representation. The directed points are then rendered (i.e., rasterized) for display on a CRT, for example.

In displaying a 3-D image of a particular object (e.g., an organ or a bone structure), it is typical to also display a portion of the structures surrounding the object to allow the viewer to become oriented within the image. It is known in the art that the perception of the viewer is improved when such orienting structures are present. Thus, an imaging examination of a patient involves the acquisition of slices additional to those actually including the object of interest. For example, in a CT examination of the orbits (i.e., eye sockets), slices ranging from the middle of the forehead to the bottom of the nose might normally be obtained.

The multiple slices within a 3-D tomographic data set are normally acquired having a slice spacing which is greater than the pixel spacing within the slices. Therefore, the resolution of a 3-D image of a surface within the body is limited by the slice spacing. When the generation of a high resolution 3-D image is a known goal of an examination, it is possible to increase the number of slices obtained and to reduce the slice spacing. However, increasing the number of slices lengthens the total scan time and reduces throughput of the tomographic imaging system. Thus, when high slice resolution is needed, it would be desirable to minimize the impact on total scan time.

Accordingly, it is a principal object of the present invention to provide a method and apparatus to reduce total scan time in a tomographic imaging apparatus while providing high resolution 3-D images of structures within the scanned body.

It is another object to generate 3-D images of objects of interest at high resolution and surrounding structures at lower resolution.

SUMMARY OF THE INVENTION

These and other objects are achieved by means of acquiring tomographic data in which the slice spacing varies as the slices are acquired. Preferably, the slice spacing is selected to provide high resolution for the body structure of interest and lower resolution for the orienting structure.

Following data acquisition, a three-dimensional surface of the structures is identified within the slices, such that an image of the surface can be displayed wherein the structure of interest is seen with a high resolution and the orienting structure is seen adjacent to the structure of interest but at a lower resolution. Preferably, the surface is identified using an interpolation of data points such that interpolated data points are generated at a uniform spacing throughout all the slices. The dividing cubes method is especially suited to such an interpolation.

BRIEF DESCRIPTION OF DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings in which:

FIG. 3 represents a portion of an array of tomographic data from which a surface is to be extracted.

FIG. 5 shows the gradient normals associated with each cube vertex.

FIG. 6 shows subcubes and their gradient normals.

FIG. 7 shows subdivision using a different amount of interpolation than FIG. 6.

DETAILED DESCRIPTION OF THE PREFERRED EMBODIMENTS

Figure 1:
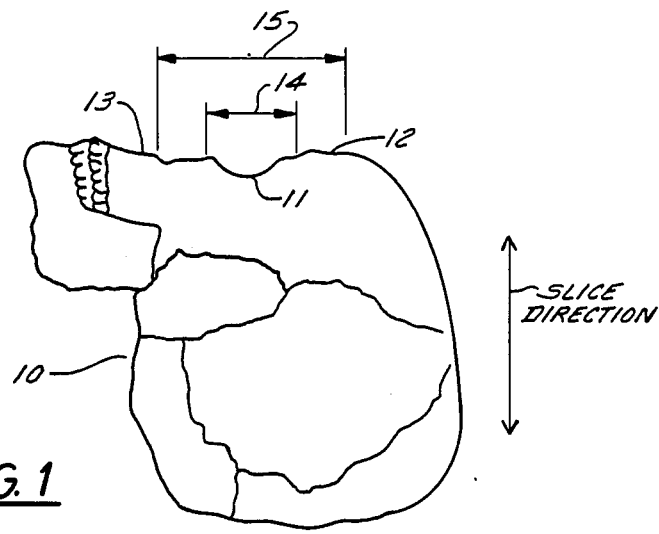
FIG. 1 is a cross-sectional view of a human head structure showing structure of interest and orienting structure.

FIG. 1 provides an example of a medical imaging study in which two-dimensional tomographic slices of skull structures obtained by means of a computed tomography (CT) scan are employed to generate a three-dimensional (3-D) image. A skull 10 includes orbits 11, a forehead 12, and maxilla 13 below the nasal area. To form a 3-D diagnostic image of orbits 11 requires a close slice spacing in order to provide sufficient resolution in the image. Thus, with a vertical slice direction as seen edge-on in FIG. 1, the structure of interest (i.e., orbits 11) is covered by acquiring slices across the volume indicated by arrow 14. However, in order to provide sufficient orienting structure in the final 3-D image, data is acquired (i.e., slices are taken) across the volume indicated by arrow 15.

Figure 2:
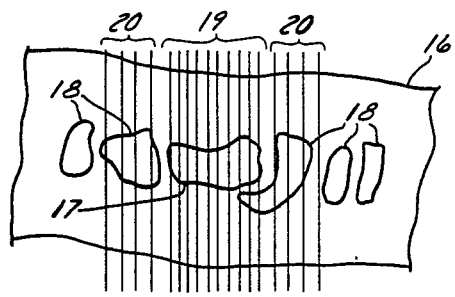
FIG. 2 is a cross-sectional view of an arbitrary body structure showing an unequal slice spacing for data acquisition.

A slice spacing according to the present invention is shown in FIG. 2. A body 16 includes a body structure of interest 17 and adjacent, orienting structures 18. Slices 19 covering structure 17 are acquired at a high resolution slice spacing sufficient to meet the diagnostic requirements of the imaging study. In order to reduce total data acquisition time, slices 20 covering orienting structures 18 are acquired at a lower resolution slice spacing sufficient to serve an orienting function.

Once all slices are collected and reconstructed to provide a plurality of 2-D images each consisting of a 2-D matrix of data points representing the physical property detected by the particular modality used (e.g., CT), a 3-D surface must be formed from the slice images. Referring to FIG. 3, a part of a 3-D tomographic array 21 is shown including a plurality of cubes 22 defined by nodes 23 connected by edges 24. Each node 23 represents a signal amplitude of a voxel (i.e., data point) of tomographic data and each edge 24 represents the distance from one voxel to its neighbor. Although the volumes described are referred to as cubes, edges 24 are typically not all of equal length and are probably not equal, especially in the present invention since slice spacing varies throughout the array (slice thickness is arbitrary). Pixel spacings P and Q and slice spacing S are shown for cube 22.

A number of techniques are known in the art for extracting the surface of an object within a tomographic data set for display as a 3-D image. Such techniques include the dividing cubes method, the marching cubes method, the cuberille method, the octree-encoding method, and the ray-tracing method. Although any of the methods could be used, the dividing cubes method is preferred.

Figure 4:
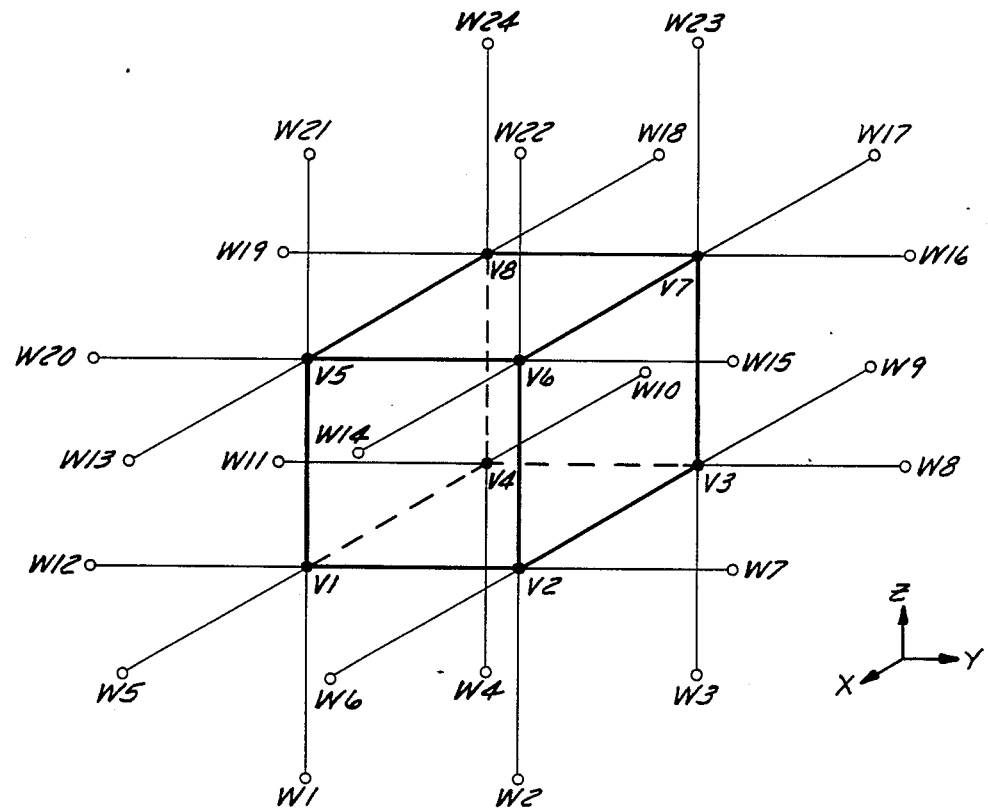
FIG. 4 is a perspective view showing a large cube and its adjacent data points.

In the practice of dividing cubes, each large cube containing the surface to be displayed (as determined by comparisons with a threshold) is subdivided by integer factors (greater than or equal to zero) into a number of subcubes. The vertices of the subcubes are compared to the threshold (or thresholds) to identify subcubes through which the surface passes. For such identified subcubes, the subcube location and normalized gradient for the subcube center are concatenated resulting in a directed point. The process of subdivision uses a large cube and adjacent points as shown in FIG. 4. Cubically adjacent voxels from the tomographic data are selected to represent the vertices V1-V8 of the large cube. Points W1-W24 are adjacent to V1-V8 and are used in conjunction with V1-V8 to calculate the gradients at the vertices of the large cube. Interpolation can then be performed on the cube and the gradients.

FIG. 5 shows examples of gradients associated with the vertices of a cube. FIG. 6 represents interpolated subcubes and gradient normals which define the subcubes within the large cube. FIG. 7 shows subcubes having different interpolation factors along different axes.

Figure 8:
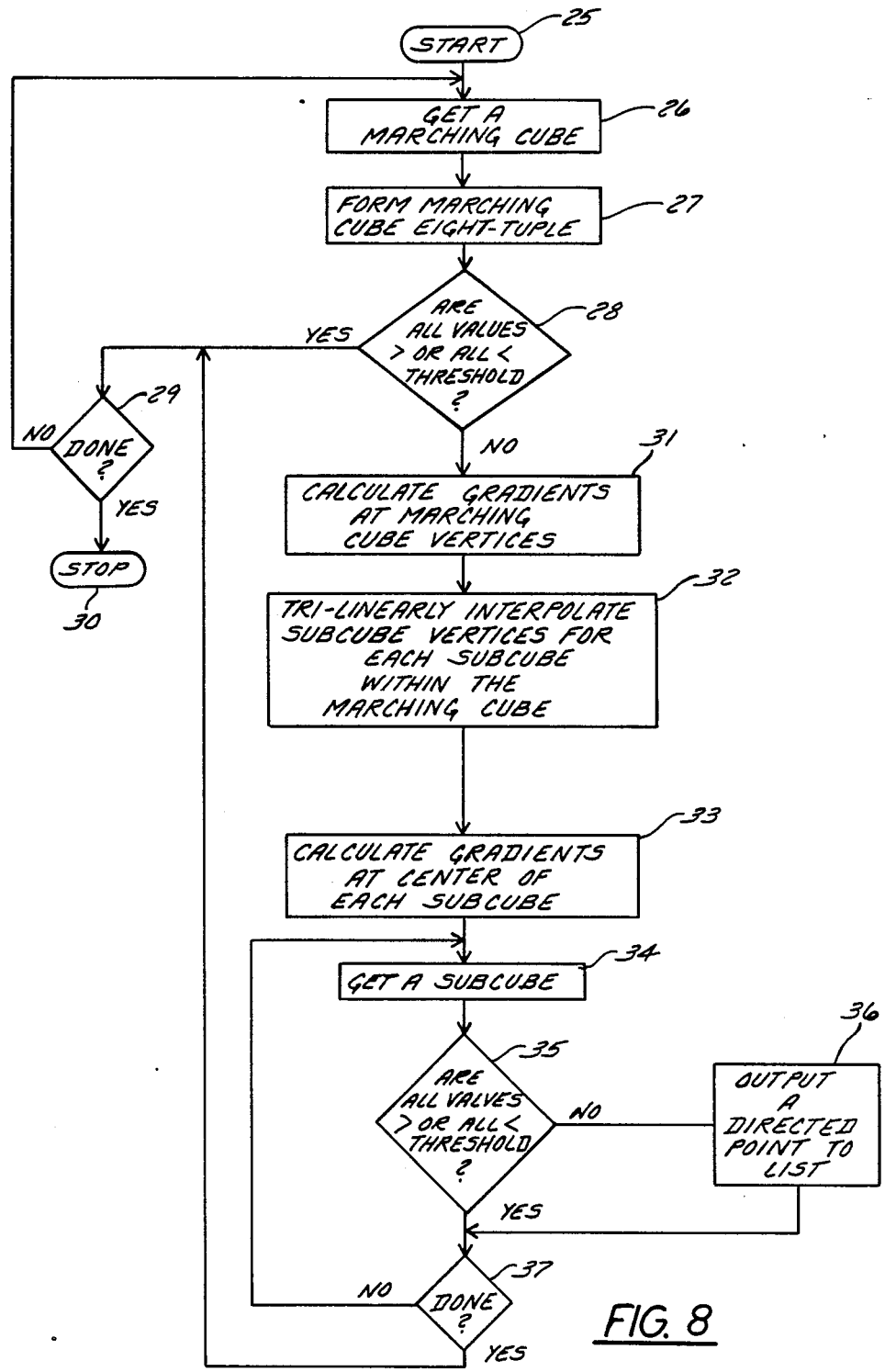
FIG. 8 is a flow chart according to the dividing cubes method.

The dividing cubes method itself will be described in more detail with reference to the flow chart in FIG. 8, which begins at start block 25. In steps 26 and 27, a large cube (i.e., marching cube) is obtained consisting of an eight-tuple of density functions f(x,y,z), namely [f(i,j,k), f(i+1,j,k), f(i,j+1,k), f(i+1,j+1,k), f(i,j,k+1), f(i+1,j,k+1), f(i,j+1,k+1), f(i+1,j+1,k+1)], where i is the row, j is the column, and k is the slice in the tomographic data. In a data base having N rows, N columns, and M slices (i.e., M is the number of N×N two-dimensional images), the marching cubes are obtained by looping through all combinations of i=2, ..., N−1; j=2, ...,N−1; and k=2, ..., M−1.

For each large cube, the eight vertices are compared to a threshold T in step 28. If all of the values for the vertices are greater than the threshold or if all are less than the threshold, then the surface does not pass through the large cube, and so the method checks to see if all large cubes have been processed in step 29. If finished, then the method halts at stop block 30 and other functions may then be performed (such as rendering and display of the defined surface). Otherwise, a return is made to step 26 to begin processing another large cube.

If step 28 determines that there are vertices both above and below the threshold (or, alternatively, both inside and outside a threshold range), then gradient values are calculated at each of the large cube vertices in step 31. Central differences can be used to calculate gradient estimates $g(i,j,k)=[g_x(i,j,k), g_y(i,j,k), g_z(i,j,k)]$ for each vertex (i,j,k) in a large cube as follows:

$$g_x(i,j,k)=[f(i+1,j,k)-f(-1,j,k)]c_1$$

$$g_y(i,j,k)=[f(i,j+1,k)-f(i,j-1,k)]c_2$$

$$g_z(i,j,k)=[f(i,j,k+1)-f(i,j,k-1)]c_3$$

where $c_1$, $c_2$ and $c_3$ are constants depending on the pixel spacing and the slice spacing in the tomographic data. Thus, eight values each of $g_x$, $g_y$ and $g_z$ are found.

Specifically, the values of $c_1$, $c_2$ and $c_3$ for each calculation are found according to:
$c_1=1/(2 * PIXEL_x)$
$c_2=1/(2 * PIXEL_y)$
$c_3=1/(z_{k+1}-z_{k-1})$
where $PIXEL_x$ and $PIXEL_y$ are the pixel spacings within the slice along the x- and y-axes, respectively, and $(z_{k+1}-z_{k-1})$ is the distance between the two slices on either side of slice k.

In step 32, density values are found for the subcube vertices by tri-linear interpolation. With positive integer interpolation factors A, B and C corresponding to i, j and k, subcube increments within a large cube are defined as $\Delta_i=1/A$, $\Delta_j=1/B$, and $\Delta_k=1/C$, respectively. Linear interpolation gives each subcube vertex density f'(I,J,K) defined as $f(i+I\Delta_i, j+J\Delta_j, k+K\Delta_k)$, where I=0,1,..., A, J=0,1,..., B, and K=0,1,..., C.

Since the slice spacing in the present invention varies, the subdivision factor C becomes dependent on the slice spacing within each particular marching cube. Thus, for a cube corresponding to a slice k, the factor C(k) is an integer large enough such that $$(z_k1-z_k)/C(k)$$

projects to no more than one pixel in the final 3-D image.

In step 33, gradient values are calculated for the center of each subcube using tri-linear interpolation of the gradients at the large cube vertices $g_x$, $g_y$ and $g_z$. The subcube gradients (each a vector G(I,J,K) with components $g_x$, $g_y$ and $g_z$) for each of the x, y and z components are $G_{x,y,z}(I,J,K)=g_{x,y,z}(i+[I+0.5]\Delta_i, j+[J+0.5]\Delta_j, k+[J+0.5]\Delta_k)$, where I=0,1, ..., A−1, J=0,1, ..., B−1, and K=0,1, ..., C−1.

Following the calculations of the subcubes and their gradients, the subcubes are fetched one at a time in step 34 by looping through all combinations of I=0, ..., A−1, J=0, ..., B−1, and K=0, ..., C−1. For each combination of I, J, and K, a subcube is defined by the eight-tuple [f'(I,J,K), f'(I+1,J,K), f'(I,J+1,K), f'(I+1,J+1,K), f'(I,J,K+1), f'(I+1,J,K+1), f'(I,J+1,K+1), f'(I+1,J+1,K+1)]. In step 35, the current subcube is tested against the threshold. If all subcube vertices are not either above or all below the threshold, then the location of the subcube and its normalized gradient are output to a list as a directed point in step 36, otherwise a check for completion is done in step 37. The gradient output to the list during step 36 is a normalized gradient defined as G(I,J,K)/|G(I,J,K)|. Furthermore, the z location of each subcube output as a directed point depends on C(k) and equals $$z_k+\{K(z_k1-z_k)/C(k)\}.$$

When all subcubes have been processed, step 37 branches back to step 29 to process the next large cube.

Figure 9:
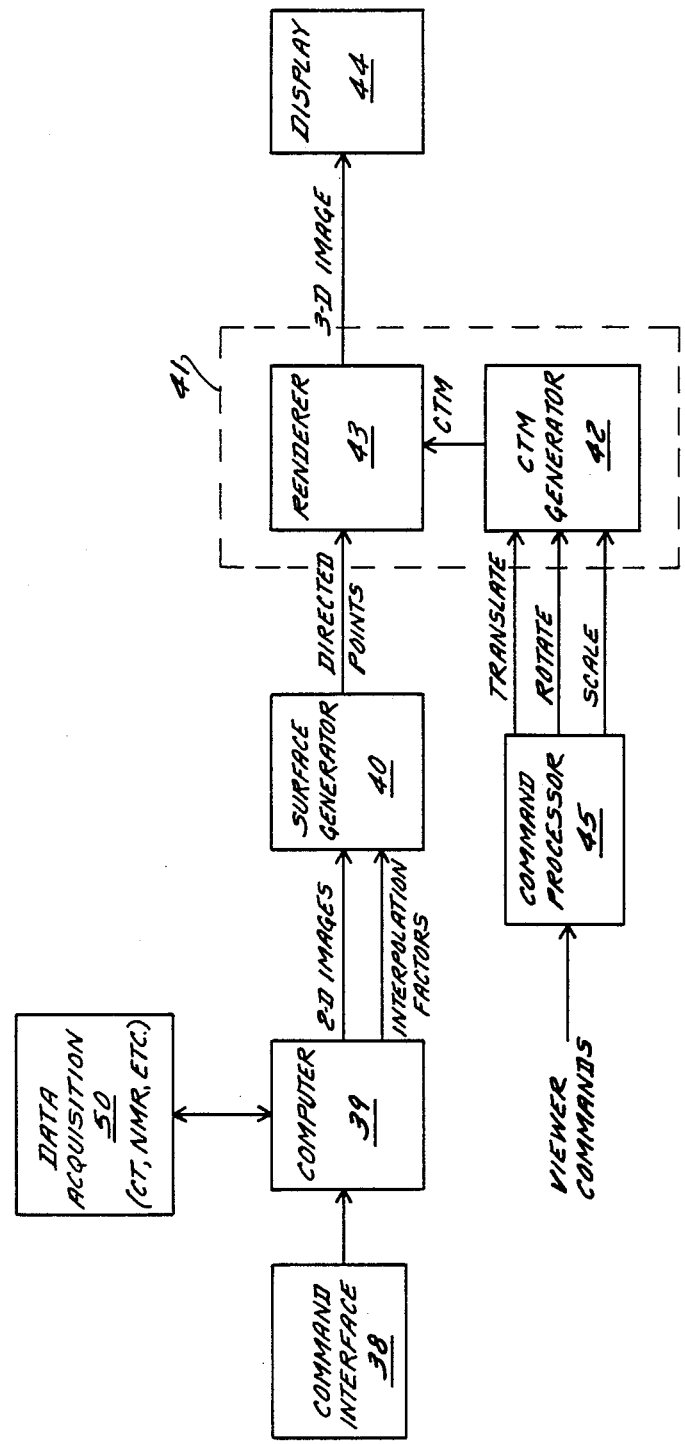
FIG. 9 is a block diagram of processing hardware in one embodiment of the invention.

A preferred apparatus for practicing the invention is shown in FIG. 9. A data acquisition system 50 collects tomographic data slices of a subject under control of a computer 39. An operator provides commands via a command interface 38 to computer 39 in order to control slice locations and spacing, for example. Computer 39 reconstructs two-dimensional tomographic images from the data collected by data acquisition system 50. The tomographic images are provided to a surface generator 40. Computer 39 also provides values for the interpolation factors for forming subcubes to surface generator 40. Surface generator 40 implements the dividing cubes method to generate a number of directed points defining the surface that are fed to a display processor 41 which includes a Current-Transformation-Matrix (CTM) generator 42 and a renderer 43.

CTM generator 42 receives a viewer's commands via a command processor 45 for scaling, moving and rotating the object and forms the CTM which is provided to renderer 43 to operate on the directed points. Renderer 43 synthesizes the 3-D image (including projecting directed points onto 3-D pixels and determining shading of illuminated pixels) which is rasterized and sent to display 44 which could be a cathode-ray tube (CRT), for example.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. A method for generating a three-dimensional representation of the surface of a structure located in a three-dimensional space comprising the steps of:
    obtaining a plurality of slices at a first slice spacing which collectively contain a first portion of said space;
    obtaining a plurality of slices at second slice spacing which collectively contain a second portion of said space, said second slice spacing being different from said first slice spacing;
    dividing said first and second space portions respectively into sets of first and second three-dimensional spatial elements;
    selecting an interpolating factor which varies as a function of said slice spacing for use in said dividing step to establish a specified relationship between a selected dimension of a first three-dimensional element and a selected dimension of a second three-dimensional element;
    specifying the location of each of said first and second three-dimensional elements in said space as a function of said interpolation factor;
    identifying each of said first and second three-dimensional elements which contains a portion of said surface, and generating a data element representing each of said portions; and
    displaying an image of said surface from said data elements, said image including a plurality of pixels.

2. The method of claim 1 wherein said interpolating factor is selected to establish a substantially equal relationship between said selected dimensions of said first and second three-dimensional elements.

3. The method of claim 1 wherein said method includes application of the dividing cubes method to determine said surface.

4. The method of claim 1 wherein said method is performed using the dividing cubes method and includes the steps of:
    (a) calculating gradient vectors at a plurality of data points in contiguous slices of said space at said first and second slice spacings, each slice being at a relative location denoted as $z_k$ within an (x,y,z,) coordinate system, the location of each data point being denoted as (i,j,k) within said coordinate system, each data point having a value f(i,j,k), and each gradient vector having components $g_x$, $g_y$, and $g_z$ calculated according to the formula:
    $g_x(i,j,k) = [f(i+1,j,k) - f(i-1,j,k)]c_1$
    $g_y(i,j,k) = [f(i,j+1,k) - f(i,j-1,k)]c_2$
    $g_z(i,j,k) = [f(i,j,k+1) - f(i,j,k-1)]c_3$
    where
    $c_1 = 1/(2*PIXEL_x)$,
    $c_2 = 1/(2*PIXEL_y)$, and
    $c_3 = 1/(z_{k+1} - z_{k-1})$
    where $PIXEL_x$ and $PIXEL_y$ are the data point spacings within each slice in the x and y directions, respectively;
    (b) subdividing each kth marching cube in the z-direction by an interpolation factor C(k) such that a subcube size of
    $(z_{k+1} - z_k)/C(k)$
    projects to not more than one of said image pixels, each of said first and second three-dimensional elements comprising one of said subcubes; and
    (c) generating interpolated data points in each kth marching cube, said interpolated data points each having a location in z given by $z_k + \{K(z_{k+1} - z_k)/C(k)\}$.

* * * * *